United States Patent
Maeda

(10) Patent No.: US 8,826,526 B2
(45) Date of Patent: Sep. 9, 2014

(54) METHOD OF MANUFACTURING MULTILAYER WIRING SUBSTRATE

(75) Inventor: Shinnosuke Maeda, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 145 days.

(21) Appl. No.: 13/281,735

(22) Filed: Oct. 26, 2011

(65) Prior Publication Data

US 2012/0102732 A1 May 3, 2012

(30) Foreign Application Priority Data

Oct. 27, 2010 (JP) ................... 2010-240610

(51) Int. Cl.
| | | |
|---|---|---|
| H05K 3/20 | (2006.01) | |
| H05K 3/36 | (2006.01) | |
| H05K 1/00 | (2006.01) | |
| H01L 21/48 | (2006.01) | |
| H05K 3/46 | (2006.01) | |
| H05K 3/00 | (2006.01) | |

(52) U.S. Cl.
CPC ...... *H05K 3/4682* (2013.01); *H05K 2201/0358* (2013.01); *H05K 2203/0228* (2013.01); *H01L 21/4857* (2013.01); *H05K 3/0026* (2013.01)
USPC .................. 29/831; 29/830; 174/250

(58) Field of Classification Search
CPC ............. H01L 21/4857; H05K 3/4682; H05K 3/3452; H05K 2201/0355
USPC ............... 29/831, 829, 830; 174/250
See application file for complete search history.

(56) References Cited

U.S. PATENT DOCUMENTS

| | | | | |
|---|---|---|---|---|
| 6,495,394 | B1 * | 12/2002 | Nakata et al. ................ | 438/107 |
| 6,736,988 | B1 * | 5/2004 | Gaku et al. .................... | 216/65 |
| 6,768,064 | B2 * | 7/2004 | Higuchi et al. .............. | 174/267 |
| 7,152,314 | B2 * | 12/2006 | Shuto et al. .................. | 29/830 |

(Continued)

FOREIGN PATENT DOCUMENTS

| | | |
|---|---|---|
| JP | 2004-235323 A | 8/2004 |
| JP | 2007-214427 A | 8/2007 |

(Continued)

OTHER PUBLICATIONS

JPO, Notification of Reason for Rejection issued in corresponding Japanese application No. 2010-240610, dispatched Jan. 28, 2014.

*Primary Examiner* — David Angwin
(74) *Attorney, Agent, or Firm* — Stites & Harbison PLLC; Jeffrey A. Haeberlin; James R. Hayne

(57) ABSTRACT

A method of manufacturing a multilayer wiring substrate is provided. A foil of a metal-foil-clad resin insulation material is brought into contact with a foil of a metal-foil-clad support substrate. A peripheral edge portion of the resin insulation material exposed as a result of removal of a peripheral edge portion of the foil is adhered to the foil of the support substrate. A plurality of conductor layers and a plurality of resin insulation layers are laminated so as to obtain a laminate structure having a wiring laminate portion, which is to become the multilayer wiring substrate. The laminate structure is cut along a boundary between the wiring laminate portion and a surrounding portion, and the surrounding portion is removed. The wiring laminate portion is separated from the support substrate along the boundary between the two foils.

7 Claims, 7 Drawing Sheets

(56) References Cited

U.S. PATENT DOCUMENTS

| | | |
|---|---|---|
| 7,297,876 B2 * | 11/2007 | Sakurai et al. ............... 174/260 |
| 7,543,376 B2 * | 6/2009 | Yoshino et al. ............... 29/852 |
| 7,597,929 B2 * | 10/2009 | Kyozuka .................... 427/96.1 |
| 8,179,689 B2 * | 5/2012 | Mashino ..................... 361/763 |
| 2003/0157307 A1 * | 8/2003 | Suzuki et al. ................ 428/209 |
| 2004/0178492 A1 * | 9/2004 | Tsukamoto et al. .......... 257/690 |
| 2004/0211751 A1 * | 10/2004 | Shuto et al. .................... 216/13 |
| 2006/0219428 A1 * | 10/2006 | Chinda et al. ................ 174/257 |
| 2006/0237225 A1 * | 10/2006 | Kariya et al. ................. 174/260 |
| 2007/0080329 A1 * | 4/2007 | Nomiya et al. ............... 252/500 |
| 2007/0166944 A1 * | 7/2007 | Japp et al. .................... 438/396 |
| 2007/0169960 A1 * | 7/2007 | Hayashi ....................... 174/262 |
| 2009/0084494 A1 * | 4/2009 | An et al. ....................... 156/250 |
| 2009/0290317 A1 * | 11/2009 | Mashino ...................... 361/782 |
| 2012/0102732 A1 * | 5/2012 | Maeda ............................ 29/847 |

FOREIGN PATENT DOCUMENTS

| | | |
|---|---|---|
| JP | 2009-004664 A | 1/2009 |
| JP | 2009-038134 A | 2/2009 |
| JP | 2009-088429 A | 4/2009 |
| JP | 2009-088464 A | 4/2009 |
| JP | 2009-224415 A | 10/2009 |
| JP | 2010-004028 A | 1/2010 |
| JP | 2010-092907 A | 4/2010 |
| JP | 2009-094403 A | 7/2010 |

* cited by examiner

METHOD OF MANUFACTURING MULTILAYER WIRING SUBSTRATE

CROSS REFERENCE TO RELATED APPLICATIONS

The present application claims priority from Japanese Patent Application No. 2010-240610, which was filed on Oct. 27, 2010, the disclosure of which is herein incorporated by reference in its entirety.

BACKGROUND OF THE INVENTION

1. Field of the Invention

The present invention relates to a method of manufacturing a multilayer wiring substrate having a multilayer structure in which a plurality of resin insulation layers and a plurality of conductor layers are laminated alternately.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package has been has been put to practical use in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductor layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

The multilayer wiring substrate shown in Patent Document 1 is manufactured by the following method. As shown in FIG. 16, there are first prepared a support substrate 81 formed of glass epoxy resin, and a separable copper foil 83 (peelable copper foil) composed of two copper foils 83a and 83b provisionally bonded in a separable manner. The separable copper foil 83 is then fixed onto the support substrate 81 via an adhesive resin layer 82. Subsequently, as shown in FIG. 17, a laminate structure 87 (build-up layer) is obtained through performance of a lamination step (build-up step) of laminating a plurality of resin insulation layers 85 and a plurality of conductor layer 86 alternately on the separable copper foil 83. Furthermore, the laminate structure 87 is cut at positions outside a product area (positions indicated by broken lines in FIG. 17), whereby the separation interface of the separable copper foil 83 (the interface between the two copper foils 83a and 83b) is exposed. After that, through separation at the separation interface of the separable copper foil 83, the laminate structure 87 is separated from the support substrate 81, whereby a coreless, thin multilayer wiring substrate is obtained.

The multilayer wiring substrate shown in Patent Document 2 is manufactured by the method shown in FIG. 18. First, there are prepared a support substrate body 91 formed of a resin substrate (pre-preg) in a semi-cured state (B-stage), a ground layer 92 formed of copper foil, and a support metal layer 93 which is formed of copper foil and which is larger in outer shape than the ground layer 92. The ground layer 92 and the support metal layer 93 are then placed on the support substrate body 91. Heat and pressure are applied to them in a vacuum atmosphere, whereby the ground layer 92 and a portion of the support metal layer 93 extending outward from the ground layer 92 are bonded onto the support substrate body 91, whereby a support substrate 94 is formed. Subsequently, as shown in FIG. 19, a laminate structure 97 is obtained through performance of a lamination step of laminating a plurality of resin insulation layers 95 and a plurality of conductor layer 96 alternately on the support metal layer 93 of the support substrate 94. Furthermore, the laminate structure 97 is cut at positions outside a product area (positions indicated by broken lines in FIG. 19), whereby the interface between the support metal layer 93 and the ground layer 92, which are formed of two copper foils, is exposed. After that, at the interface between the support metal layer 93 and the ground layer 92, the laminate structure 97 is separated from the support substrate 94, whereby a coreless, thin multilayer wiring substrate is obtained.

RELATED ART DOCUMENTS

Patent Documents

Patent Document 1 is Japanese Patent Application Laid-open (kokai) No. 2007-214427.
Patent Document 2 is Japanese Patent Application Laid-open (kokai) No. 2009-94403.

BRIEF SUMMARY OF THE INVENTION

The above-described multilayer wiring substrate manufacturing method disclosed in Patent Document 1 uses the separable copper foil 83, which is a special member. Since this separable copper foil 83 is expensive as compared with ordinary copper foil, the multilayer wiring substrate requires a higher manufacturing cost. Furthermore, in the case of the method disclosed in Patent Document 2, the ground layer 92 and the support metal layer 93 formed of two copper foils must be bonded onto the support substrate body 91 through application of heat and pressure onto the support substrate 94, which is a resin substrate. As described above, since a heat and pressure application step is additionally required for preparation of the support substrate 94, manufacturing cost increases.

Moreover, in the case of the method disclosed in Patent Document 2, as shown in FIG. 18, the support metal layer 93, which is disposed on the upper side, is larger in outer shape than the ground layer 92. The support metal layer 93 and the ground layer 92 are fixed to the support substrate body 91 by means of pressing a peripheral edge portion of the support metal layer 93 against the support substrate body 91. The support metal layer 93 and the ground layer 92 are each formed of copper foil, and have no flowability. Moreover, although two copper foils; i.e., the support metal layer 93 and the ground layer 92, are present at a central portion, at a peripheral edge portion, the ground layer 92 is not present, and only a single copper foil; i.e., only the support metal layer 93, is present. Accordingly, a step is formed on the support substrate 94 between the central portion where two copper foils are present and the peripheral edge portion where only one copper foil is present. In the above-described lamination step, positioning is performed with alignment marks or the like provided in the peripheral edge portion being used as marks. If a step is present at that portion, accurate positioning becomes impossible. Since the support metal layer 93 and the ground layer 92 are placed on the support substrate body 91 in a semi-cured state, it becomes difficult for the support metal layer 93 to have a sufficient degree of flatness. Therefore, in the case where, after separation of the laminate structure 97, the exposed support metal layer 93 is patterned so as to form external terminals, the flatness of the external terminals deteriorates, which brings about a problem of deteriorated connection reliability of the external terminals.

The present invention has been conceived in view of the above problems, and an object of the invention is to provide a method of manufacturing a multilayer wiring substrate which can reduce manufacturing cost.

A means (Means 1) for solving the above problems is a method of manufacturing a multilayer wiring substrate having a multilayer structure in which a plurality of resin insulation layers and a plurality of conductor layers are laminated alternately. The method comprising an insulation layer fixation step of laying a lower metal foil and an upper metal foil directly on each other, disposing the lower metal foil and the upper metal foil on a support base material such that the upper metal foil and a peripheral edge portion of the lower metal foil are exposed (i.e., exposed at the surface side of the support base material), adhering a resin insulation material (which is to become one resin insulation layer) to a surface of the upper metal foil, and fixing a peripheral edge portion of the resin insulation material to the support base material; a lamination step of laminating the conductor layers and the resin insulation layers so as to obtain a laminate structure having, on the upper metal foil, a wiring laminate portion which is to become the multilayer wiring substrate; a removal step of cutting, after the lamination step, the laminate structure along a boundary between the wiring laminate portion and a surrounding portion located around the wiring laminate portion, to thereby remove the surrounding portion; and a separation step of separating the wiring laminate portion from the support base material along a boundary between the upper and lower metal foils.

According to the invention described in Means 1, a coreless multilayer wiring substrate can be manufactured through use of upper and lower metal foils, which are ordinary metal foils, without use of a separable copper foil, which is a special metal foil used in the method disclosed in Patent Document 1. Therefore, material cost can be reduced. Furthermore, the lower metal foil of the present invention is larger in outer shape than the upper metal foil, and, in the insulation layer fixation step, the metal foils are disposed on the support base material such that the upper metal foil and a peripheral edge portion of the lower metal foil are exposed at the surface. The resin insulation material, which is to become one of the resin insulation layers, is then adhered to the surface of the upper metal foil, and a peripheral edge portion of the resin insulation material is fixed to the support base material. This procedure enables the copper foil to be fixed to the support base material by making use of the step of forming the resin insulation layer. Therefore, the method of the present embodiment does not require a dedicated step for fixing a support metal layer to a support substrate as in the case of the method disclosed in Patent Document 2. As a result, the manufacturing cost of the multilayer wiring substrate can be reduced. Additionally, in the insulation layer fixation step, the upper copper foil is pressed by the resin insulation material, which has flowability, and a peripheral edge portion of the resin insulation material is fixed to the support base material. Therefore, a step is hardly formed on the surface of the upper copper foil, and positioning in the lamination step can be performed accurately.

In accord with another aspect of the invention, a method of manufacturing a multilayer wiring substrate comprises a preparation step of preparing a metal-foil-clad support base material which includes a support base material and a lower metal foil provided on a surface of the support base material, and a metal-foil-clad resin insulation material which includes a resin insulation material and an upper metal foil provided on the surface of the resin insulation material; a metal foil removal step of removing a peripheral edge portion of the upper metal foil of the metal-foil-clad resin insulation material. Rather than a special material, general purpose materials which are generally used in manufacture of the multilayer wiring substrate can be used as the metal-foil-clad support base material and the metal-foil-clad resin insulation material. Notably, the resin insulation material prepared in this preparation step is an insulation material which is to become the outermost resin insulation layer exposed on the side toward one main face of the multilayer wiring substrate.

According to this aspect, in the insulation layer fixation step, the upper metal foil of the metal-foil-clad resin insulation material is brought into contact with the lower metal foil of the metal-foil-clad support base material, and a peripheral edge portion of the resin insulation material exposed as a result of removal of a peripheral edge portion of the upper metal foil is adhered to the lower metal foil of the metal-foil-clad support base material, whereby the metal-foil-clad resin insulation material is fixed to the metal-foil-clad support base material. In this case, portions of the upper metal foil and the lower metal foil which contact with each other do not adhere to each other, and a peripheral edge portion of the resin insulation material is adhered to the lower metal foil of the support base material. In the lamination step, the plurality of conductor layers and the plurality of resin insulation layers are laminated in order to form a laminate structure. In the removal step, the laminate structure is cut along the boundary between the wiring laminate portion, which is to become a multilayer wiring substrate, and a surrounding portion around the wiring laminate portion, whereby a peripheral edge portion of the laminate structure where the resin insulation material and the lower metal foil of the support base material adhere together is removed. As a result, the wiring laminate portion becomes separable from the support base material at a position where the upper metal foil and the lower metal foil contact with each other (the boundary between the two metal foils). In the separation step, the wiring laminate portion is separated from the support base material along the boundary between the two metal foils.

In the preparation step, preferably, the support base material is formed by use of a material whose coefficient of thermal expansion is approximately equal to those of the resin insulation layers. In this case, in the lamination step, thermal stress becomes unlikely to concentrate at the interface between the support base material and the resin insulation layers laminated thereon. Therefore, problems such as formation of wrinkles on the copper foils can be avoided. Notably, the phrase "the support base material is formed of a material whose coefficient of thermal expansion is approximately equal to those of the resin insulation layers" means that the difference between the coefficient of thermal expansion of the support base material and that of the resin insulation layers falls within a range of ±5 ppm/° C.

Another means (Means 2) for solving the above problems is a method of manufacturing a multilayer wiring substrate having a laminate structure in which a plurality of resin insulation layers and a plurality of conductor layers are laminated alternately. The method comprises an insulation layer fixation step of disposing a single metal foil on a support base material, adhering a resin insulation material, which is to become one resin insulation layer, to a surface of the single metal foil, and fixing a peripheral edge portion of the resin insulation material to a surface of the support base material; a lamination step of laminating the conductor layers and the resin insulation layers so as to obtain a laminate structure having, on the single metal foil, a wiring laminate portion, which is to become the multilayer wiring substrate; a removal step of cutting, after the lamination step, the laminate structure along a boundary between the wiring laminate portion and a surrounding portion located around the wiring laminate portion, to thereby remove the surrounding portion; and a separation step of separating the wiring laminate portion from the support base material along the single metal foil (i.e., along a surface of the single metal foil).

According to the invention described in Means 2, a coreless multilayer wiring substrate can be manufactured through use of a single metal foil without use of a separable copper foil, which is a special metal foil used in the conventional technique. In this case, material cost can be reduced, whereby manufacturing cost of the multilayer wiring substrate can be reduced.

Preferably, the metal foil(s) is a copper foil(s); and the method further comprises a terminal formation step of forming external terminals through patterning of the copper foil exposed at the surface of the wiring laminate portion after the separation step. In this case, since the copper foil used for separating the wiring laminate portion and the support base material from each other becomes the external terminals of the multilayer wiring substrate, manufacturing cost can be reduced as compared with the case where the external terminals are formed by use of another copper foil or copper plating.

Furthermore, in the case where, like the invention described in Means 1, lower and upper copper foils are laid directly on each other and are disposed on the support base material in the insulation layer fixation step, the lower copper foil is made larger in outer shape than the upper copper foil so that the upper copper foil does not project from the peripheral edge portion of the lower copper foil. In this case, even when the resin insulation material is caused to adhere to the surface of the upper copper foil and press the upper copper foil, the flatness of the upper copper foil can be secured sufficiently. Accordingly, in the terminal formation step, external terminals having a high degree of flatness can be formed through patterning of the upper copper foil exposed at the surface of the wiring laminate portion.

Examples of the external terminals formed in the terminal formation step include connection terminals to which an IC chip or a chip capacitor is connected, and connection terminals to which a motherboard is connected.

The method of manufacturing a multilayer wiring substrate may further comprise a roughening step of roughening the surface of the metal foil to which the resin insulation material is adhered. In this case, since the resin insulation material, which is to later become one of the resin insulation layers, adheres to the metal foil without fail, the plurality of conductor layers and the plurality of resin insulation layers can be laminated without fail in the lamination step.

The plurality of resin insulation layers which partially constitute the multilayer wiring substrate can be selected freely in consideration of electrical insulating performance, heat resistance, humidity resistance, etc. Preferred examples of a polymeric material used to form the resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Examples of the filler contained in the resin insulation layers include filters formed of inorganic oxides, such as silica, titania, and alumina. In particular, since silica filler is low in dielectric constant and coefficient of linear thermal expansion, addition of silica filler to the resin insulation layers further enhance the quality of the multilayer wiring substrate.

The support base material may be a resin plate formed of a completely cured resin material or a metal plate formed of a metallic material. The resin material and metal material for forming the support base material may be those which are inexpensive and relatively hard. However, in the case where the laminate structure is cut together with the support base material in the removal step, preferably, a resin substrate which can be readily cut is used as the support base material.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
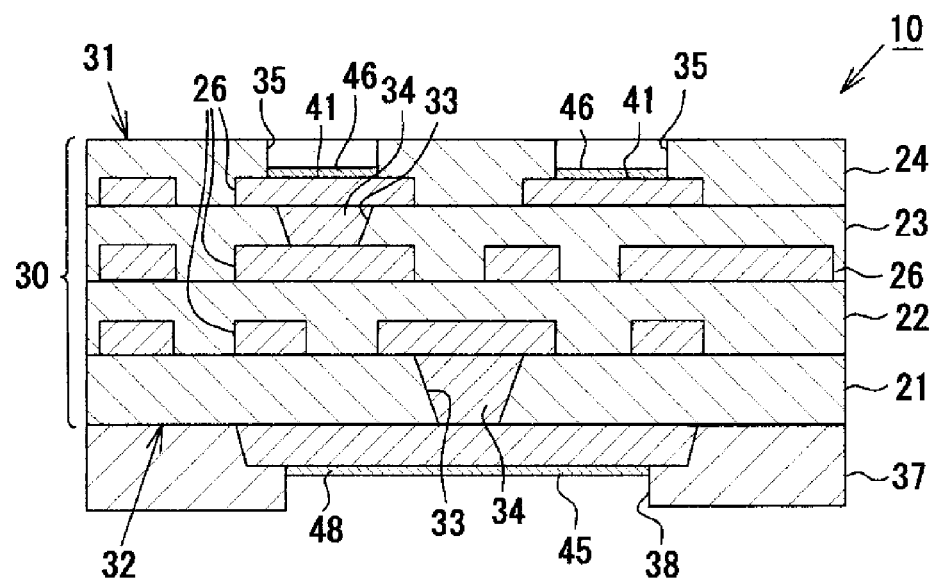
FIG. 1 is an enlarged sectional view schematically showing the structure of a multilayer wiring substrate according to an embodiment of the present invention.

A method of manufacturing multilayer wiring substrate according to a first embodiment of the present invention will next be described in detail with reference to the drawings. FIG. 1 is an enlarged sectional view schematically showing the structure of a multilayer wiring substrate 10 according to the present embodiment.

As shown in FIG. 1, the multilayer wiring substrate 10 is a coreless wiring substrate having no substrate core and having a multilayer wiring laminate portion 30 in which four resin insulation layers 21, 22, 23, and 24 made primarily of the same resin insulation material, and conductor layers 26 made of copper are laminated alternately. The resin insulation layers 21 to 24 are formed of a build-up material made primarily of a cured resin insulation material that is not photocurable; specifically, a cured thermosetting epoxy resin. In the multilayer wiring substrate 10, a plurality of connection terminals 41 are disposed on the side of the wiring laminate portion 30 where the top surface 31 thereof is present.

In the present embodiment, the plurality of connection terminals 41 are IC-chip connection terminals to which an IC chip is connected, and are disposed in an array on the top surface 31 side of the wiring laminate portion 30. Meanwhile, on the opposite side of the wiring laminate portion 30 where a bottom surface 32 thereof is present, a plurality of connection terminals 45 for LGA (land grid array) to which a motherboard is connected are disposed in an array. The motherboard connection terminals 45 are greater in area than the IC-chip connection terminals 41 on the top surface 31 side.

Via holes 33 and filled-via conductors 34 are provided in the resin insulation layers 21, 22, and 23. The via conductors 34 are shaped such that their diameters increase in the same direction (in FIG. 1, in the direction from the bottom surface side toward the top surface side). The via conductors 34 electrically interconnect the conductor layers 26, the IC-chip connection terminals 41, and the motherboard connection terminals 45.

A plurality of openings 35 are formed in the fourth resin insulation layer 24 exposed to the outside on the top surface 31 side of the wiring laminate portion 30. The IC chip connection terminals 41 are disposed in the openings 35 such that their upper surfaces become lower than the surface of the resin insulation layer 24. Peripheral portions of the upper surfaces of the IC chip connection terminals 41 are buried in the resin insulation layer 24. The IC-chip connection terminals 41 are made mainly of a copper layer. Furthermore, the IC-chip connection terminals 41 have a structure in which a plating layer 46 of a material other than copper (specifically, a nickel-gold plating layer) covers only the upper surface of the copper layer serving as a main constituent of the IC-chip connection terminals 41.

On the bottom surface 32 side of the wiring laminate portion 30, the surface of the resin insulation layer 21 is covered substantially completely by a solder resist layer 37. The solder resist layer 37 has openings 38 therein so as to expose the motherboard connection terminals 45. In the present embodiment, the openings 38 are smaller in size than the motherboard connection terminals 45, and peripheral portions of the lower surfaces of the motherboard connection terminals 45 are buried in the solder resist layer 37. The motherboard connection terminals 45 are made mainly of a copper layer. Furthermore, the motherboard connection terminals 45 have a structure in which a plating layer 48 of a material other than copper (specifically, a nickel-gold plating layer) covers only the lower surface of the copper layer serving as a main constituent of the motherboard connection terminals 45.

The thus-configured multilayer wiring substrate 10 is fabricated by, for example, the following procedure.

Figure 2:
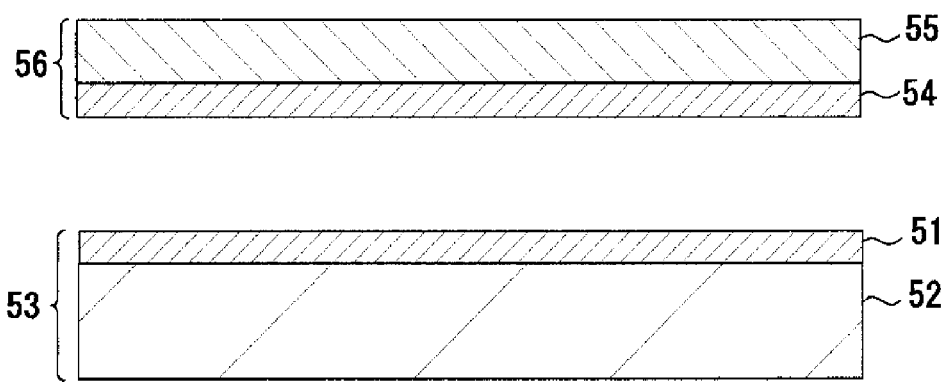
FIG. 2 is an explanatory view showing a method of manufacturing the multilayer wiring substrate.

First, in a preparation step, as shown in FIG. 2, there is prepared a copper-foil-clad support substrate 53 (metal-foil-clad support base material) composed of a support substrate 52 (support base material) and a copper foil 51 (serving as a lower metal foil) provided on the surface of the support substrate 52. Also, there is prepared a copper-foil-clad build-up material 56 (metal-foil-clad resin insulation material) composed of a resin insulation material 55 and a copper foil 54 (serving as an upper metal foil) provided on the surface of the resin insulation material 55. The support substrate 52 is, for example, formed of a completely cured resin material having a coefficient of thermal expansion (27 ppm/° C.) approximately equal to the coefficient of thermal expansion (30 ppm/° C.) of the resin insulation layers 21 to 24 of the wiring laminate portion 30. The resin insulation material 55 of the copper-foil-clad build-up material 56 is an uncured insulation material which is formed of an epoxy resin sheet and which is to later become the resin insulation layer 21.

In the present invention, the "coefficient of thermal expansion" refers to the coefficient of thermal expansion as measured in a direction (x-y direction) perpendicular to the thickness direction (z direction). The coefficient of thermal expansion is measured for a range of 0° C. to 100° C. through TMA (thermomechanical analysis), which is defined in, for example, JPCA-BU01.

Figure 3:
FIG. 3 is an explanatory view showing the method of manufacturing the multilayer wiring substrate.
Figure 4:
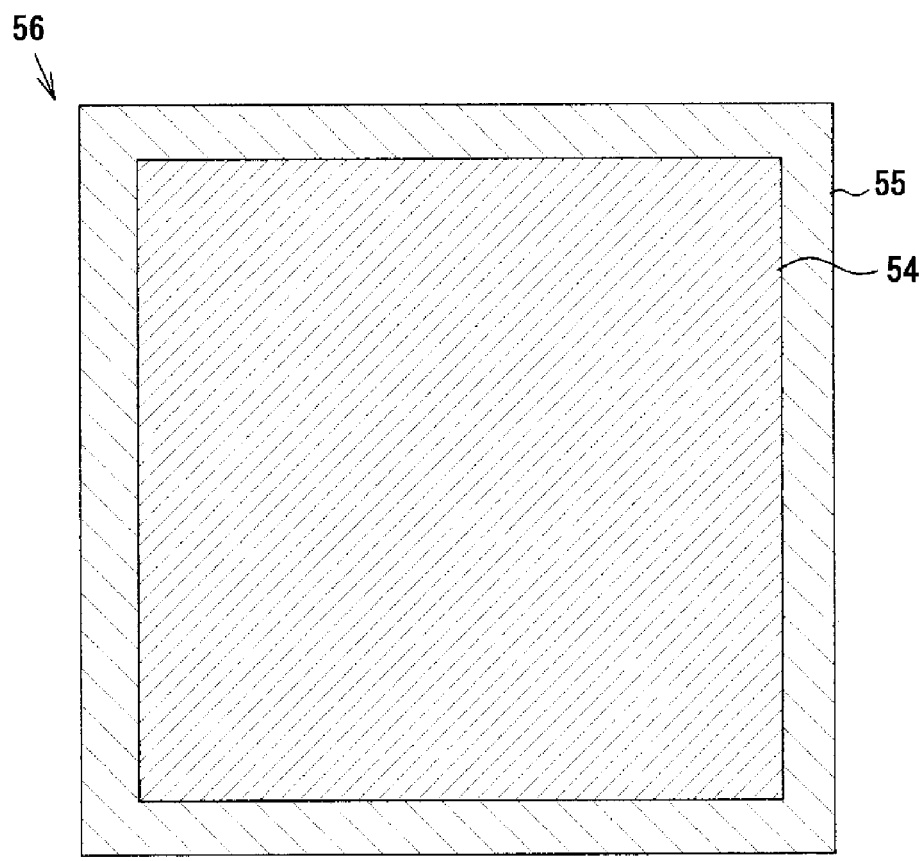
FIG. 4 is an explanatory view showing the method of manufacturing the multilayer wiring substrate.

Then, in a metal foil removal step, a peripheral edge portion of the copper foil 54 of the copper-foil-clad build-up material 56 is removed (see FIGS. 3 and 4). Specifically, a dry film for formation of an etching resist layer is laminated on the surface of the copper foil 54 of the copper-foil-clad build-up material 56, and exposure and development are carried out for the dry film so as to form an etching resist layer covering a central portion of the surface of the copper foil 54. After that, a peripheral edge portion of the copper layer 54 is removed through etching, and the etching resist layer, which becomes unnecessary, is removed from the surface of the build-up material 56. As a result, a portion of the copper layer 54 having a quadrangle shape remains on the surface of the build-up material 56 at the center thereof. As a result of the removal of the peripheral edge portion of the copper foil 54, a peripheral edge portion of the resin insulation material 55 is exposed (see FIG. 4). Notably, after the metal foil removal step, the copper foil 54 of the build-up material 56 is smaller in outer shape than the copper foil 51 of the support substrate 53.

Figure 5:
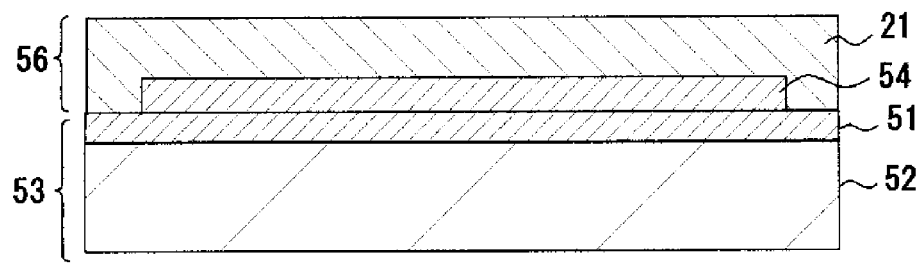
FIG. 5 is an explanatory view showing the method of manufacturing the multilayer wiring substrate.

Subsequently, in an insulation layer fixation step, the copper foil 54 of the copper-foil-clad build-up material 56 is brought into contact with the copper foil 51 of the support substrate 53, and the resin insulation material 55 exposed at the peripheral edge portion of the copper-foil-clad build-up material 56 is adhered to the copper foil 51 of the support substrate 53. Thus, the resin insulation material 55, which will become the resin insulation layer 21, is fixed to the support substrate 53 (see FIG. 5). Thus, the peripheral edge portion of the lower copper foil 51 and the upper foil layer 54 are exposed at the surface of the support substrate 53, and the exposed surfaces are covered by the resin insulation layer 21.

Figure 6:
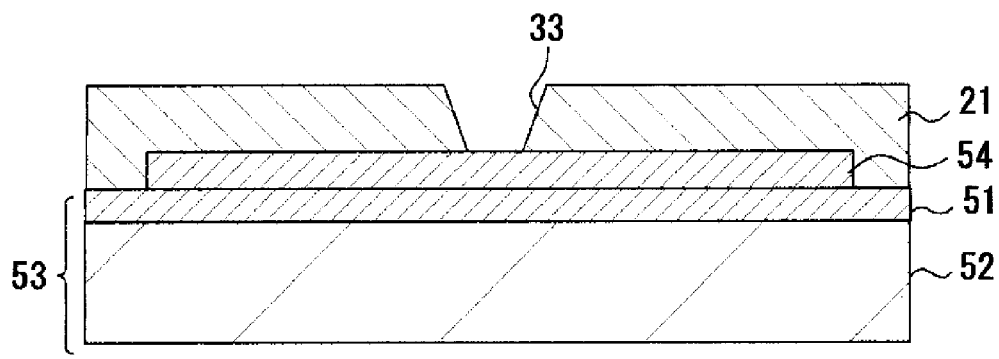
FIG. 6 is an explanatory view showing the method of manufacturing the multilayer wiring substrate.

Subsequently, as shown in FIG. 6, the via holes 33 are formed in the resin insulation layer 21 at predetermined positions by means of performing laser beam machining by use of, for example, an excimer laser, a UV laser, or a $CO_2$ laser. Next, by use of etchant, such as a potassium permanganate solution, a desmear step is performed for removing smears from inside the via holes 33. In the desmear step, in place of treatment by use of etchant, plasma ashing by use of, for example, $O_2$ plasma may be performed.

Figure 7:
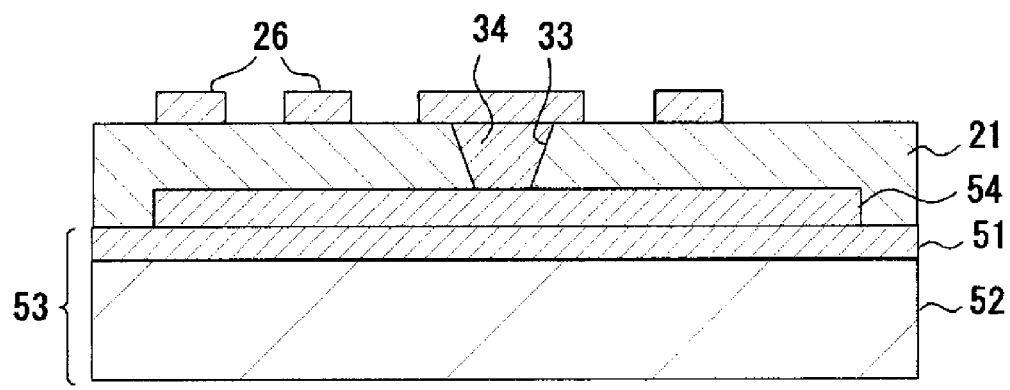
FIG. 7 is an explanatory view showing the method of manufacturing the multilayer wiring substrate.

After the desmear step, electroless copper plating and copper electroplating are performed by a known process, thereby forming the via conductors 34 in the via holes 33. Further, etching is performed by a known process (e.g., semi-additive process), thereby forming the conductor layer 26 in a predetermined pattern on the resin insulation layer 21 (see FIG. 7).

Figure 8:
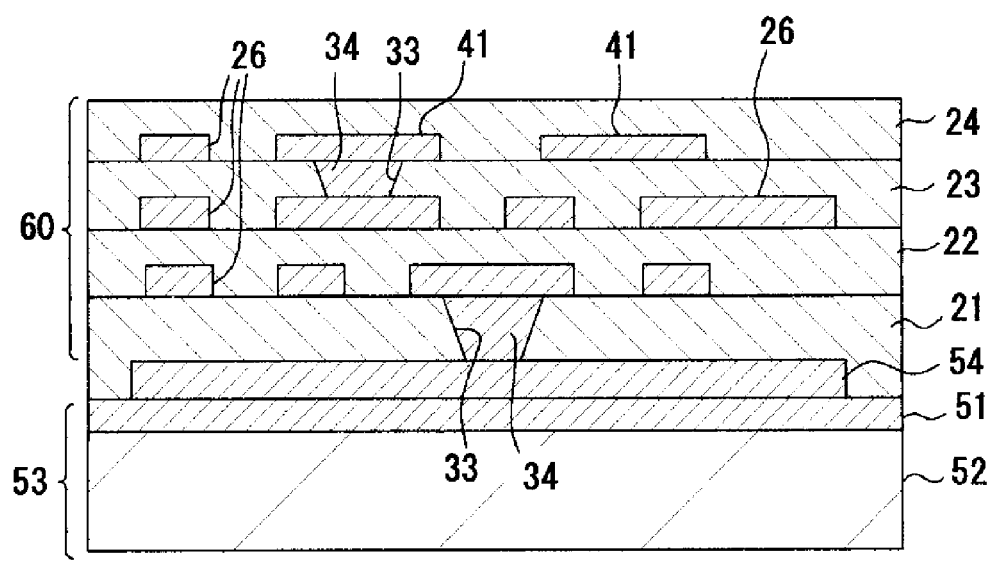
FIG. 8 is an explanatory view showing the method of manufacturing the multilayer wiring substrate.

Also, the second to fourth resin insulation layers 22 to 24 and the corresponding conductor layers 26 are formed and laminated on the resin insulation layer 21 by processes similar to those used to form the first resin insulation layer 21 and the associated conductor layer 26 (lamination step). By the above-described steps, there is formed a wiring laminate 60 in which the copper foils 51 and 54, the resin insulation layers 21 to 24, and the conductor layers 26 are laminated on the support substrate 52 (see FIG. 8). Notably, a portion of the wiring laminate 60 which is located above the copper foil 54 will become the wiring laminate portion 30 of the multilayer wiring substrate 10. Also, portions of the conductor layer 26 formed between the fourth resin insulation layer 24 and the third resin insulation layer 23 become the IC chip connection terminals 41.

Figure 9:
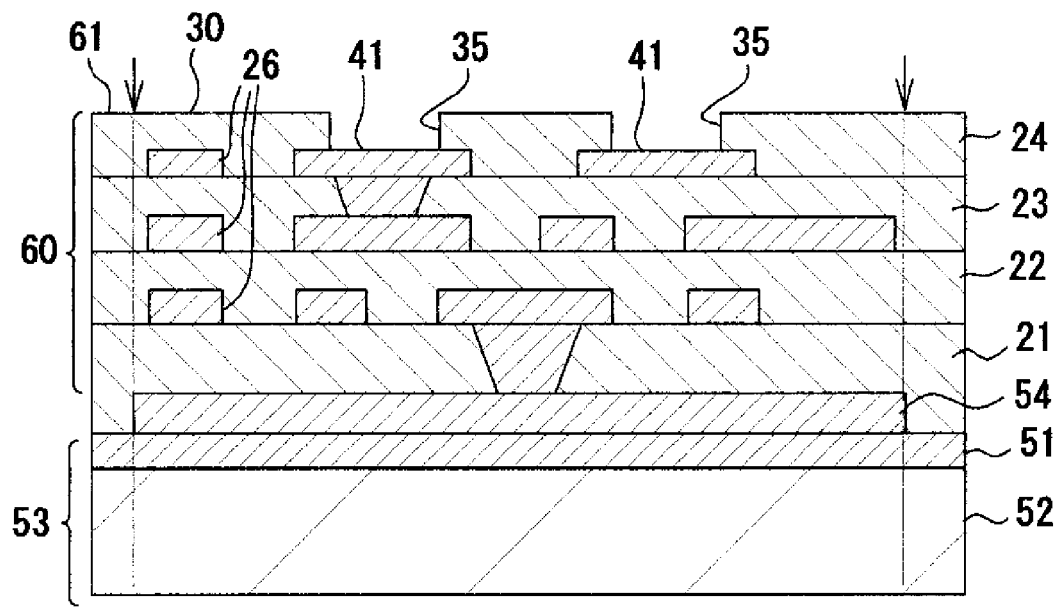
FIG. 9 is an explanatory view showing the method of manufacturing the multilayer wiring substrate.

Subsequently, as shown in FIG. 9, the plurality of openings 35 is formed in the outermost resin insulation layer 24 by means of laser drilling, whereby the upper surfaces of the IC chip connection terminals 41 are exposed. Next, there is performed a desmear step in which smears are removed from inside the openings 35 by use of a potassium permanganate solution, $O_2$ plasma, etc.

After the desmear step, the wiring laminate 60 is cut by a dicing apparatus (not shown) so as to remove a surrounding portion around the wiring laminate portion 30 (removal step). At this time, as shown in FIG. 9, the wiring laminate 60 is cut together with the support substrate 53 located under the wiring laminate portion 30, along the boundary (indicated by the arrows in FIG. 9) between the wiring laminate portion 30 and a surrounding portion 61. As a result of this cutting, peripheral edge portions of the copper foils 51 and 54 which have been sealed in the resin insulation layer 21 are exposed. That is, as a result of removal of the surrounding portion 61, a bonded portion between the copper foil 51 of the copper-foil-clad support substrate 53 and the resin insulation layer 21 is lost. Consequently, the wiring laminate portion 30 and the copper-foil-clad support substrate 53 are connected together merely through the two copper foils 51 and 54.

Figure 10:
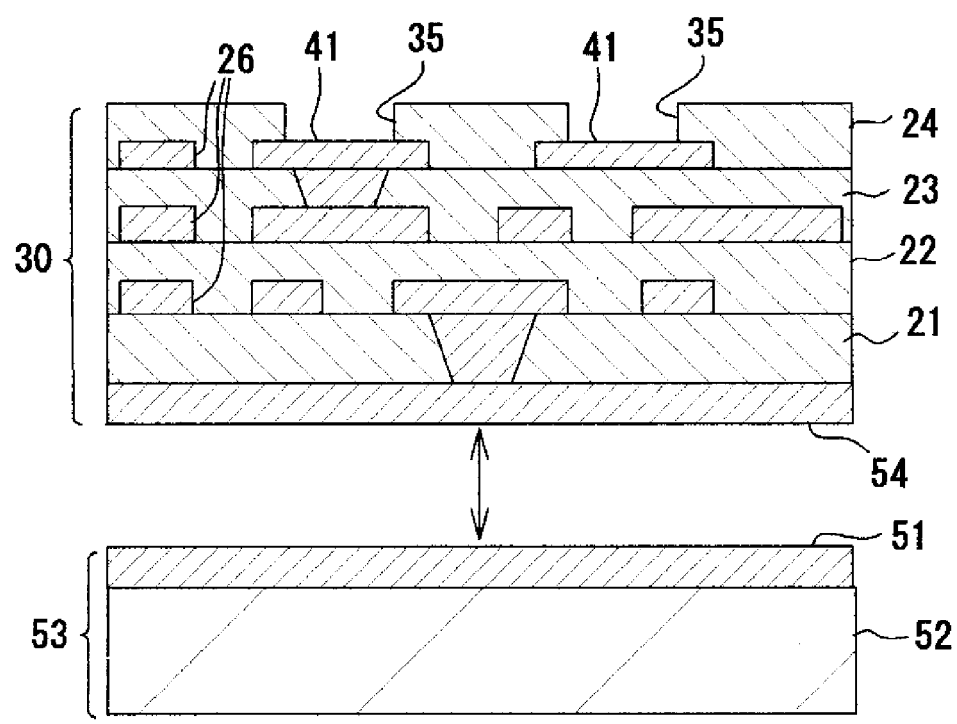
FIG. 10 is an explanatory view showing the method of manufacturing the multilayer wiring substrate.
Figure 11:
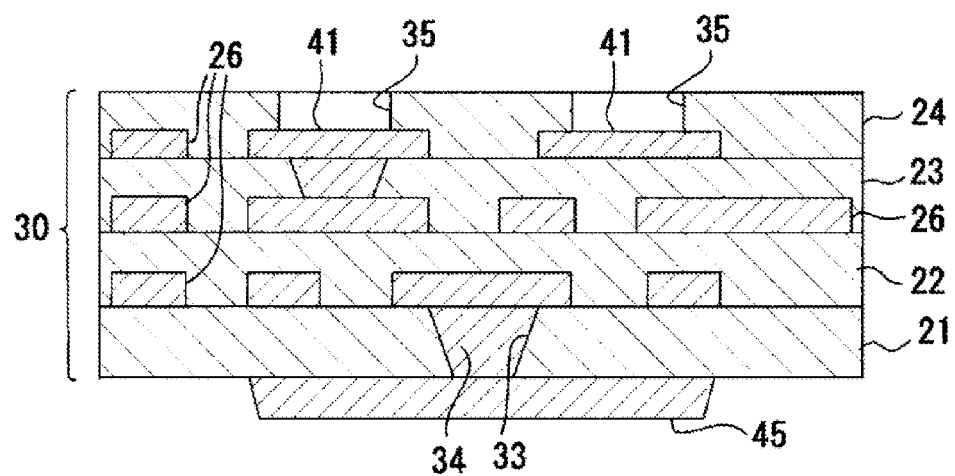
FIG. 11 is an explanatory view showing the method of manufacturing the multilayer wiring substrate.

Subsequently, as shown in FIG. 10, through separation at the interface between the two foils 51 and 54, the copper-foil-clad support substrate 53 is removed form the wiring laminate portion 30, whereby the copper foil 54 provided on the bottom surface of the wiring laminate portion 30 (the resin insulation layer 21) is exposed (separation step). After that, the copper foil 54 of the wiring laminate portion 30 is patterned by a subtractive method (terminal formation step). Specifically, a dry film is laminated on the top surface 31 and the bottom surface 32 of the wiring laminate portion 30, and exposure and development are performed for the dry film. Thus, an etching resist layer is formed on the top surface 31 of the wiring laminate portion 30 such that the etching resist layer covers the entirety of the top surface 31, and an etching resist layer is formed on the bottom surface 32 of the wiring laminate portion 30 in a predetermined pattern corresponding to the motherboard connection terminals 45. In this state, patterning is performed for the copper foil 54 of the wiring laminate portion 30 through etching, whereby the motherboard connection terminals 45 (external terminals) are formed on the resin insulation layer 21. Subsequently, the etching resist layers formed on the top surface 31 and the bottom surface 32 of the wiring laminate portion 30 are peeled off for removal (see FIG. 11).

Next, photosensitive epoxy resin is applied onto the resin insulation layer 21 and is cured so as to form the solder resist layer 37. Exposure and development are then performed with a predetermined mask placed thereon so as to form the openings 38 in the solder resist layer 37.

After that, electroless nickel plating and electroless gold plating are successively performed on the surfaces (upper surfaces) of the IC-chip connection terminals 41 exposed from the openings 35 and on the surfaces (lower surfaces) of the motherboard connection terminals 45 exposed from the openings 38, whereby the nickel-gold plating layers 46 and 48 are formed. Through the above-described steps, the multilayer wiring substrate 10 of FIG. 1 is fabricated.

Therefore, the present embodiment can yield the following effects.

(1) In the present embodiment, the coreless multilayer wiring substrate 10 can be manufactured through use of the copper-foil-clad support substrate 53 and the copper-foil-clad build-up material 56, without use of the separable copper foil 83, which is a special metal foil used in the method disclosed in Patent Document 1. In place of a special material, general purpose materials which are generally used in manufacture of the multilayer wiring substrate can be used as the copper-foil-clad support substrate 53 and the copper-foil-clad build-up material 56. Therefore, material cost can be reduced, as compared with the conventional technique.

Figure 18:
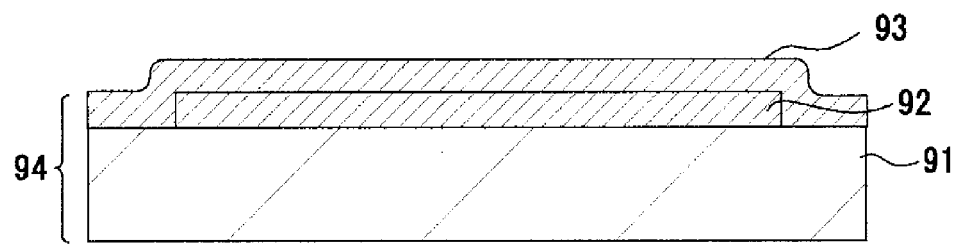
FIG. 18 is an explanatory view showing a second conventional method of manufacturing the multilayer wiring substrate.
Figure 19:
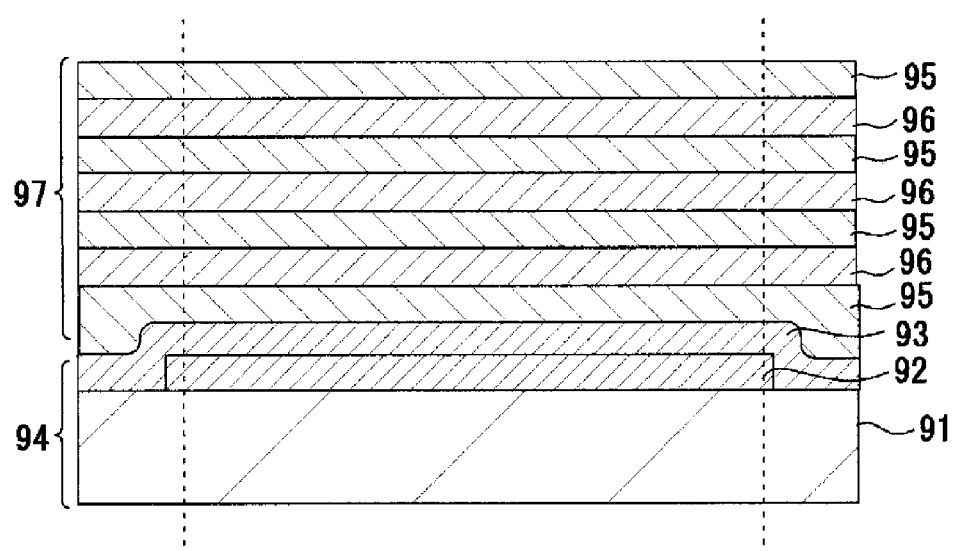
FIG. 19 is an explanatory view showing the second conventional method of manufacturing the multilayer wiring substrate.

(2) In the present embodiment, in the insulation layer fixation step, the copper foil 54 of the copper-foil-clad build-up material 56 is brought into contact with the copper foil 51 of the support substrate 53, and a peripheral edge portion of the resin insulation material 55 exposed through removal of a peripheral edge portion of the copper foil 54 is adhered to the copper foil 51 of the support substrate 53, whereby the resin insulation layer 21 is fixed to the support substrate 53. This procedure enables the copper foil 54 to be fixed to the support substrate 53 by making use of the step of forming the resin insulation layer 21. Therefore, the method of the present embodiment does not require a dedicated step (see FIG. 18) of the method disclosed in Patent Document 2 for fixing the support metal layer 93 to the support substrate 94. As a result, the manufacturing cost of the multilayer wiring substrate 10 can be reduced. Additionally, in the insulation layer fixation step, the copper foil 54 is pressed by the resin insulation material 55, which is in an uncured state and which therefore has flowability, whereby a peripheral edge portion of the resin insulation material 55 is fixed to the support substrate 53. Therefore, a step is hardly formed on the surface of the copper foil 54, and positioning in the lamination step can be performed accurately.

(3) In the present embodiment, the support substrate 52 is formed by use of a material whose coefficient of thermal expansion is the same as that of the resin insulation layers 21 to 24. In this case, in the lamination step, thermal stress becomes unlikely to concentrate at the interface between the support substrate 52 and the resin insulation layers 21 to 24 laminated thereon. Therefore, problems such as formation of wrinkles on the copper foils 51 and 54 can be avoided.

(4) In the present embodiment, in the terminal formation step, the motherboard connection terminals 45 are formed through patterning of the copper foil 54 utilized for separation of the wiring laminate portion 30 from the support substrate 53. Thus, the manufacturing cost of the multilayer wiring substrate 10 can be reduced, as compared with the case where the motherboard connection terminals 45 are formed from another copper foil or copper plating.

(5) In the present embodiment, the lower copper foil 51 is larger in outer shape than the upper copper foil 54, and, in the insulation layer fixation step, the upper copper foil 54 is disposed on the support substrate 53 such that the upper copper foil 54 does not project from the peripheral edge of the lower copper foil 51. In this case, even when the resin insulation material 55 of the build-up material 56 is pressed from the upper side, the flatness of the upper copper foil 54 can be secured sufficiently. Accordingly, in the terminal formation step, the motherboard connection terminals 45 having a high degree of flatness can be formed through patterning of the copper foil 54 exposed at the surface of the wiring laminate portion 30. Thus, the connection reliability of the motherboard connection terminals 45 can be secured sufficiently.

Notably, the embodiment of the present invention may be modified as follows.

Figure 12:
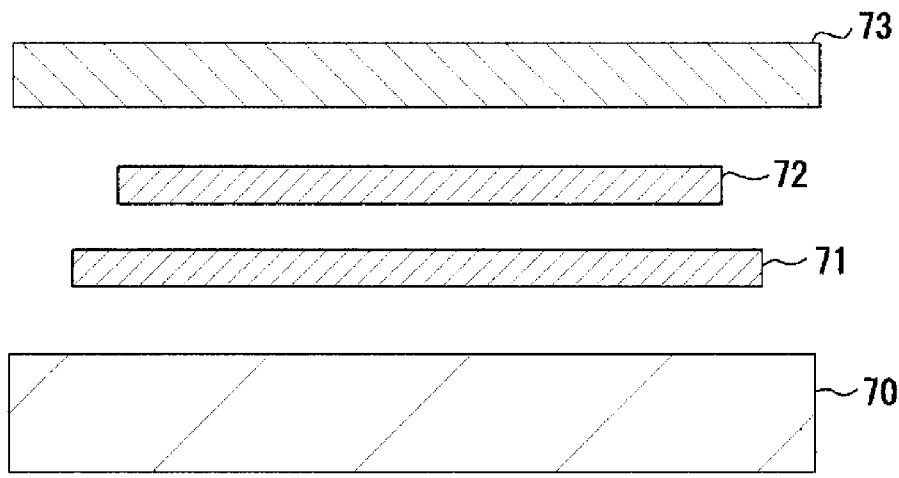
FIG. 12 is an explanatory view showing a second method of manufacturing the multilayer wiring substrate.

In the above-described embodiment, the multilayer wiring substrate 10 is manufactured by use of the copper-foil-clad support substrate 53 and the copper-foil-clad build-up material 56. However, the method of manufacturing the multilayer wiring substrate 10 is not limited thereto. Specifically, in a preparation step, as shown in FIG. 12, there are prepared a support substrate 70 having no copper foil, two copper foils 71 and 72 (serving as the lower and upper metal foils), and a resin insulation material (build-up material) 73 having no copper foil. The support substrate 70 is formed of a completely cured resin material. The resin insulation material 73 is an uncured insulation material which is to later become the resin insulation layer 21. Furthermore, the copper foil 71, which serves as the lower metal foil, is larger in outer shape than the copper foil 72, which serves as the upper metal foil.

Figure 13:
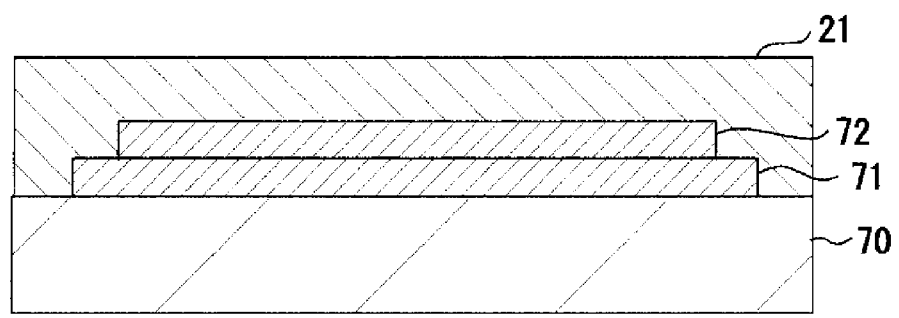
FIG. 13 is an explanatory view showing the second method of manufacturing the multilayer wiring substrate.

Subsequently, in an insulation layer fixation step, as shown in FIG. 13, the two copper foils 71 and 72 are laid directly on each other, and are placed on the support substrate 70 such that the upper copper foil 72 and a peripheral edge portion of the lower copper foil 71 are exposed at the surface of the support substrate 70. After that, the resin insulation material 73 is adhered to the surface of the copper foil 72 and the surface of the peripheral edge portion of the copper foil 71, and the peripheral edge portion of the resin insulation material 73 is adhered to the support substrate 70. Thus, the resin insulation material 73, which will become the resin insulation layer 21, is fixed to the support substrate 70. After that, manufacturing steps (a lamination step, a removal step, a separation step, a terminal formation step, etc.) similar to those of the above-described embodiment are carried out. As a result, the multilayer wiring substrate 10 shown in FIG. 1 is manufactured. In the case where the above-described alternative method is employed as well, the multilayer wiring substrate 10 can be manufactured through use of the two foils 71 and 72, which are ordinary metal foils, without use of the separable copper foil 83, which is a special metal foil used in the method disclosed in Patent Document 1. Therefore, manufacturing cost of the multilayer wiring substrate 10 can be reduced, as compared with the conventional technique. Furthermore, the lower copper foil 71 is larger in outer shape than the upper copper foil 72, and the copper foils 71 and 72 are disposed on the support substrate 70 such that the upper copper foil 72 does not project from the peripheral edge of the lower copper foil 71. In this case, even when the resin insulation material 73 is caused to adhere to the surface of the upper copper foil 72 and press the upper copper foil 72, the flatness of the copper foil 72 can be secured sufficiently. Accordingly, in the terminal formation step, the motherboard connection terminals 45 having a high degree of flatness can be formed through patterning of the copper foil 72. Thus, the connection reliability of the motherboard connection terminals 45 can be secured sufficiently.

In the above-described insulation layer fixation step, a ground resin insulation layer serving as an adhesive layer may be interposed between the lower copper foil 71 and the support substrate 70. Since this configuration enables bonding of the entire lower surface of the copper foil 71 to the support substrate 70, in the separation step, the separation at the interface between the copper foils 71 and 72 can be performed without fail.

Also, the above-described manufacturing steps may further include a surface roughening step of roughening the surface of the copper foil 72, to which the resin insulation material 73 is adhered. When this configuration is employed, the resin insulation material 73, which will later become the resin insulation layer 21, adheres to the copper foil 72 without fail. Therefore, in the lamination step, the plurality of the conductor layers 26 and the plurality of resin insulation layers 21 to 24 can be laminated without fail.

Figure 14:
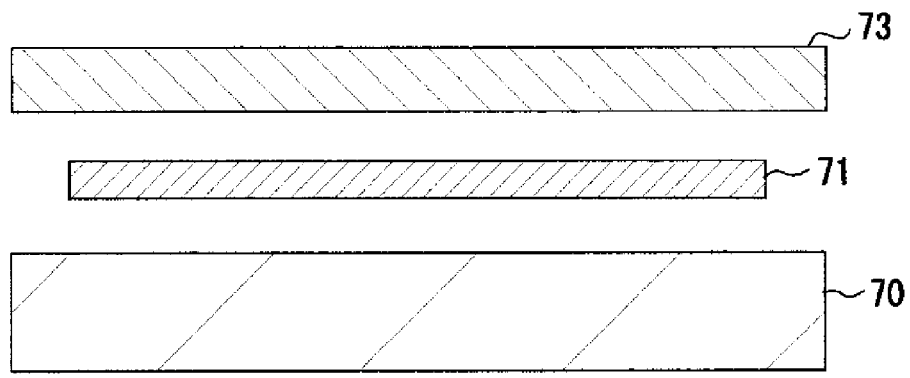
FIG. 14 is an explanatory view showing a third method of manufacturing the multilayer wiring substrate.
Figure 15:
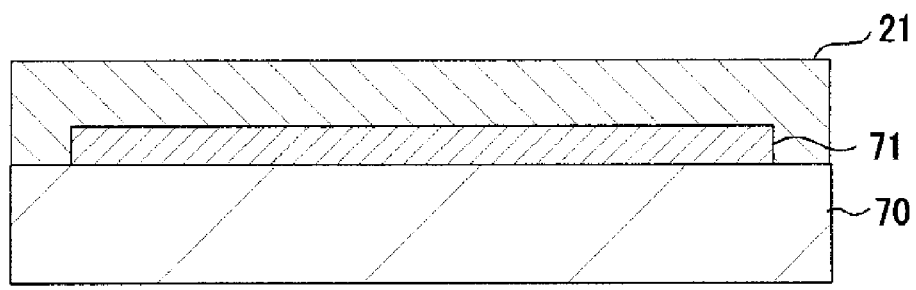
FIG. 15 is an explanatory view showing the third method of manufacturing the multilayer wiring substrate.
Figure 16:
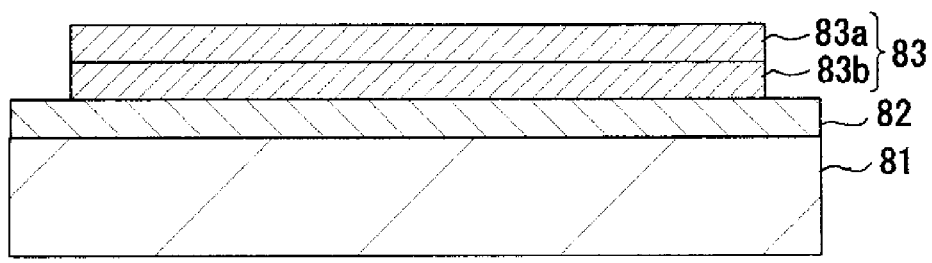
FIG. 16 is an explanatory view showing a conventional method of manufacturing the multilayer wiring substrate.
Figure 17:
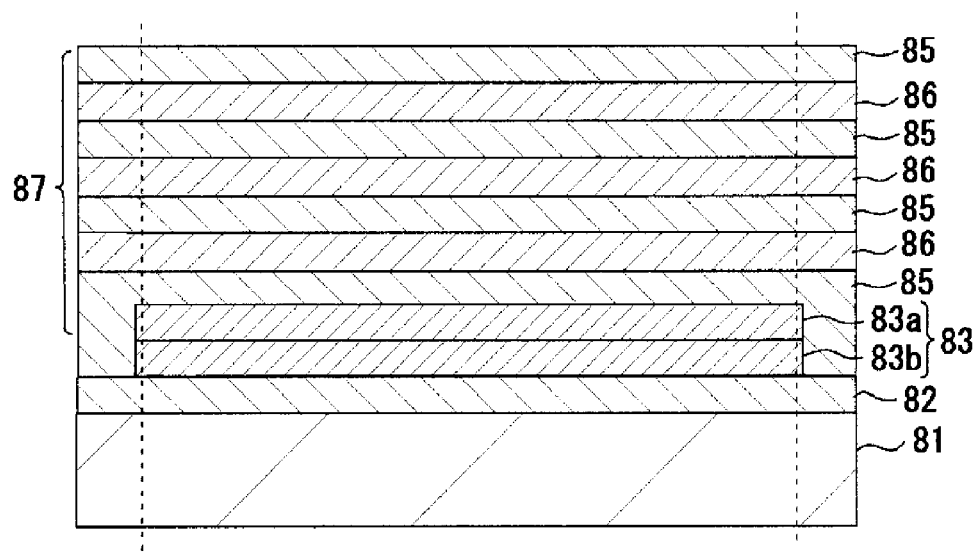
FIG. 17 is an explanatory view showing the conventional method of manufacturing the multilayer wiring substrate.

In the above-described embodiment, the two copper foils 51 and 54 (71 and 72) are disposed on the support substrate 52 (70) for manufacture of the multilayer wiring substrate 10. The method of manufacturing the multilayer wiring substrate 10 is not limited thereto, and the multilayer wiring substrate 10 may be manufactured by use of a single copper foil. This manufacturing method will be described in detail. In a preparation step, as shown in FIG. 14, there are prepared a support substrate 70 having no copper foil, a single copper foil 71 (serving as a metal foil), and a resin insulation material 73 having no copper foil. The support substrate 70 is formed of a completely cured resin material. The resin insulation material 73 is an uncured insulation material which is to later become the resin insulation layer 21. Subsequently, in an insulation layer fixation step, as shown in FIG. 15, the single copper foil 71 is placed on the support substrate 70, the resin insulation material 73 is adhered to the surface of the copper foil 71, and the peripheral edge portion of the resin insulation material 73 is adhered to the surface of the support substrate 70. After that, a lamination step similar to that in the above-described embodiment is performed so as to form the laminate structure 60 having the wiring laminate portion 30 on the copper foil 71 of the support substrate 70. Furthermore, a removal step similar to that in the above-described embodiment is performed so as to cut the wiring laminate 60, together with the support substrate 70 located under the wiring laminate portion 30, along the boundary between the wiring laminate portion 30 and a surrounding portion 61 located around the wiring laminate portion 30, to thereby remove the surrounding portion 61. As a result of the removal of the surrounding portion 61, a bonded portion between the support substrate 70 and the resin insulation layer 21 is lost. Consequently, the wiring laminate portion 30 and the support substrate 70 are connected together merely through the copper foil 71. In a separation step, the wiring laminate portion 30 is separated from the support substrate 70 at the interface between the copper foil 71 and the support substrate 70. After that, a terminal formation step, etc. are performed as in the above-described embodiments, whereby the multilayer wiring substrate 10 is manufactured. In this case as well, the multilayer wiring substrate 10 can be manufactured without use of the separable copper foil 83, which is a special metal foil used in the method disclosed in Patent Document 1.

In the above-described embodiment, the multilayer wiring substrate 10 is manufactured by laminating the resin insulation layers 21 to 24 and the conductor layers 26 from the bottom surface 32 side where the motherboard connection terminals 45 are formed. However, the method of manufacturing the multilayer wiring substrate 10 is not limited thereto. A multilayer wiring substrate may be manufactured by laminating the resin insulation layers 21 to 24 and the conductor layers 26 from the top surface 31 side where the IC chip connection terminals 41 are formed. In this case, in the terminal formation step, the IC chip connection terminals 41 are formed through patterning of the copper foil 54. Furthermore, the plurality of conductors 26 formed in the plurality of resin insulation layer 21 to 24 are connected with one another via conductors 34 whose diameters increase from the top surface 31 side toward the bottom surface 32 side.

In the above-described embodiment, the motherboard connection terminals 45 are formed through patterning of the copper foil 54. However, the method of forming the motherboard connection terminals 45 is not limited thereto. For example, in the lamination step, external terminals are formed, through patterning, in advance as a portion of the conductor layer 26 provided between the first resin insulation layer 21 and the second resin insulation layer 22. Subsequently, after the separation step, the copper foil 54 exposed at the bottom surface of the wiring laminate portion 30 is completely removed through etching. After that, laser drilling is performed on the resin insulation layer 21 so as to form openings for exposing the external terminals. Even when this alternative method is employed, a coreless multilayer wiring substrate can be manufactured.

Next, technical ideas that the embodiments described above implement are enumerated below.

(1) A method of manufacturing a multilayer wiring substrate having a laminate structure in which a plurality of resin insulation layers and a plurality of conductor layers are laminated alternately, the method comprising an insulation layer fixation step of laying a lower metal foil and an upper metal foil directly on each other in an unbonded state, disposing them on a support base material such that the upper metal foil and a peripheral edge portion of the lower metal foil are exposed at the surface of the support base material, adhering an uncured resin insulation material, which is to later become one of the resin insulation layers, to the surface of the upper metal foil, and fixing a peripheral edge portion of the resin insulation material to the support base material; a lamination step of laminating the conductor layers and the resin insulation layers so as to obtain a laminate structure having, on the metal foil, a wiring laminate portion, which is to become the multilayer wiring substrate; a removal step of cutting, after the lamination step, the laminate structure together with the support base material, along a boundary between the wiring laminate portion and a surrounding portion located around the wiring laminate portion, to thereby remove the surrounding portion; and a separation step of separating the wiring laminate portion from the support base material along the boundary between the upper and lower metal foils.

(2) The method of manufacturing a multilayer wiring substrate according to the technical idea (1) is characterized by further comprising a surface roughening step of roughening the surface of the metal foil to which the resin insulation material is adhered.

(3) The method of manufacturing a multilayer wiring substrate according to the technical idea (1) or (2) is characterized in that the resin insulation material prepared in the preparation step is an insulation material which is to become the outermost resin insulation layer exposed on the side toward one main face of the multilayer wiring substrate.

(4) The method of manufacturing a multilayer wiring substrate according to any one of the technical ideas (1) to (3) is characterized in that the support base material is a resin plate formed of a completely cured resin material or a metal plate formed of a metal material.

DESCRIPTION OF REFERENCE NUMERALS

10: multilayer wiring substrate
21 to 24: resin insulation layer
26: conductor layer
30: wiring laminate portion
45: motherboard connection terminal (external terminal)
51, 71: copper foil (lower metal foil)
52, 70: support substrate (support base material)
53: copper-foil-clad support substrate (metal-foil-clad support base material)
54, 72: copper foil (upper metal foil)
55, 73: resin insulation material
56: copper-foil-clad build-up material (metal-foil-clad resin insulation base material)
60: laminate structure
61: surrounding portion

What is claimed is:

1. A method of manufacturing a multilayer wiring substrate, the method comprising:
an insulation layer fixation step of laying a lower metal foil and an upper metal foil directly on each other, disposing the lower metal foil, which is larger in outer shape than the upper metal foil, and the upper metal foil on a support base material, adhering a resin insulation material to a surface of the upper metal foil and an upper surface of a peripheral edge portion of the lower metal foil, and fixing a peripheral edge portion of the resin insulation material directly to the support base material;
a lamination step of alternately laminating conductor layers and resin insulation layers on the resin insulation material so as to obtain a laminate structure having, on the upper metal foil, a wiring laminate portion which is to become the multilayer wiring substrate;
a removal step of cutting, after the lamination step, the laminate structure along a boundary between the wiring laminate portion and a surrounding portion located around the wiring laminate portion, to thereby remove the surrounding portion; and
a separation step of separating the wiring laminate portion from the support base material along a boundary between the upper and lower metal foils.

2. A method of manufacturing a multilayer wiring substrate having a multilayer structure in which a plurality of resin insulation layers and a plurality of conductor layers are laminated alternately, the method comprising:
- a preparation step of preparing a metal-foil-clad support base material which includes a support base material and a lower metal foil provided on a surface of the support base material, and a metal-foil-clad resin insulation material which includes a resin insulation material and an upper metal foil provided on a surface of the resin insulation material;
- a metal foil removal step of removing a peripheral edge portion of the upper metal foil of the metal-foil-clad resin insulation material;
- an insulation layer fixation step of bringing the upper metal foil of the metal-foil-clad resin insulation material into contact with the lower metal foil of the metal-foil-clad support base material, and adhering a peripheral edge portion of the resin insulation material exposed as a result of removal of a peripheral edge portion of the upper metal foil to the lower metal foil of the metal-foil-clad support base material, whereby the metal-foil-clad resin insulation material is fixed to the metal-foil-clad support base material;
- a lamination step of laminating the conductor layers and the resin insulation layers so as to obtain a laminate structure having, on the upper metal foil, a wiring laminate portion which is to become the multilayer wiring substrate;
- a removal step of cutting, after the lamination step, the laminate structure along a boundary between the wiring laminate portion and a surrounding portion located around the wiring laminate portion, to thereby remove the surrounding portion; and
- a separation step of separating the wiring laminate portion from the support base material along a boundary between the upper and lower metal foils.

3. The method of manufacturing a multilayer wiring substrate according to claim 2, wherein, in the preparation step, the support base material is formed of a material whose coefficient of thermal expansion is approximately equal to that of the resin insulation layers.

4. A method of manufacturing a multilayer wiring substrate having a laminate structure in which a plurality of resin insulation layers and a plurality of conductor layers are laminated alternately, the method comprising:
- an insulation layer fixation step of disposing a single metal foil on a support base material, adhering a resin insulation material, which is to become one resin insulation layer, to a surface of the single metal foil, and fixing a peripheral edge portion of the resin insulation material to a surface of the support base material;
- a lamination step of laminating the conductor layers and the resin insulation layers so as to obtain a laminate structure having, on the single metal foil, a wiring laminate portion, which is to become the multilayer wiring substrate;
- a removal step of cutting, after the lamination step, the laminate structure along a boundary between the wiring laminate portion and a surrounding portion located around the wiring laminate portion, to thereby remove the surrounding portion; and
- a separation step of separating the wiring laminate portion from the support base material along the single metal foil.

5. The method of manufacturing a multilayer wiring substrate according to claim 1, wherein the upper metal foil is a copper foil; and the method further comprises a terminal formation step of forming external terminals through patterning of the copper foil exposed at a surface of the wiring laminate portion after the separation step.

6. The method of manufacturing a multilayer wiring substrate according to claim 2, wherein the upper metal foil is a copper foil; and the method further comprises a terminal formation step of forming external terminals through patterning of the copper foil exposed at a surface of the wiring laminate portion after the separation step.

7. The method of manufacturing a multilayer wiring substrate according to claim 4, wherein the single metal foil is a copper foil; and the method further comprises a terminal formation step of forming external terminals through patterning of the copper foil exposed at a surface of the wiring laminate portion after the separation step.

* * * * *